United States Patent [19]

Chen

[11] Patent Number: 5,782,095
[45] Date of Patent: Jul. 21, 1998

[54] CRYOGEN RECONDENSING SUPERCONDUCTING MAGNET

[75] Inventor: William E. Chen, Florence, S.C.

[73] Assignee: General Electric Company, Milwaukee, Wis.

[21] Appl. No.: 933,471

[22] Filed: Sep. 18, 1997

[51] Int. Cl.[6] ............................................. F17C 5/02
[52] U.S. Cl. ............................................. 62/47.1; 62/51.1
[58] Field of Search .............................. 62/47.1, 51.1

[56] References Cited

U.S. PATENT DOCUMENTS

| | | | |
|---|---|---|---|
| 4,790,147 | 12/1988 | Kungama et al. | 62/514 R |
| 4,891,951 | 1/1990 | Ishibashi | 62/51.3 |
| 5,092,130 | 3/1992 | Nagao | 62/6 |
| 5,163,297 | 11/1992 | Yani et al. | 62/47.1 |
| 5,176,003 | 1/1993 | Horikawa et al. | 62/51.1 |
| 5,265,430 | 11/1993 | Chen et al. | 62/51.1 |
| 5,381,666 | 1/1995 | Saho et al. | 62/47.1 |
| 5,701,744 | 12/1997 | Eckels et al. | 62/51.1 |

*Primary Examiner*—Ronald C. Capossela
*Attorney, Agent, or Firm*—Irving M. Freedman; John H. Pilarski

[57] ABSTRACT

A helium cooled superconducting magnet assembly with helium gas recondensing apparatus to return liquid helium to the helium supply in the helium vessel in which the recondensing apparatus positioned within the space between the vacuum vessel and surrounding vacuum vessel in thermal contact with a cryocooler within a fixed cryocooler sleeve in the vacuum vessel with the cryocooler positioned to minimize magnetic disturbances to the magnet assembly magnetic field and the recondenser connected through thin corrugated steel tubing to the helium vessel with the tubing sized to provide thermal and vibration isolation of the helium vessel.

10 Claims, 2 Drawing Sheets

1

CRYOGEN RECONDENSING SUPERCONDUCTING MAGNET

BACKGROUND OF INVENTION

This invention relates to helium cooled superconducting magnet assemblies suitable for magnetic resonance imaging (hereinafter called "MRI"), and more particularly to an improved and simplified means within the helium vessel for recondensing the resultant helium gas back into liquid helium.

As is well known, a superconducting magnet can be made superconducting by placing it in an extremely cold environment, such as by enclosing it in a cryostat or pressure vessel containing liquid helium or other liquid cryogen. The extreme cold insures that the magnet coils are maintained in superconducting operation, such that when a power source is initially connected to the magnet coils (for a period, for example, of 10 minutes) to introduce a current flow through the coils, the current will continue to flow through the coils even after power is removed due to the absence of electrical resistance in the coils, thereby maintaining a strong magnetic field. Superconducting magnet assemblies find wide application in the field of MRI.

Considerable research and development efforts have been directed at minimizing the need to replenish the boiling cryogen such as liquid helium. While the use of liquid helium to provide cryogenic temperatures is widely practiced and is satisfactory for MRI operation the provision of a steady supply of liquid helium to MRI installations all over the world has proved to be difficult and costly.

It is common practice to vent the helium gas resulting from the boiling helium, and to periodically replenish the helium supply. As a result, it is highly desirable to efficiently minimize the amount of liquid helium required and to minimize or eliminate the need to continually replenish the liquid helium supply as the liquid helium boils in providing the superconducting temperature for the superconducting magnet assembly.

Another problem encountered in the use of liquid helium to provide cryogenic temperatures for superconducting magnet assemblies is in storing the necessary reserve supply of liquid helium at cryogenic temperatures of 4° K. (or close to absolute zero), and the related problem of periodically transferring a portion of the liquid helium in the storage reservoir to the liquid helium supply in the superconducting magnet.

Various attempts have been made to recycle the helium off-gas resulting from the boiling helium. They have not been entirely satisfactory because of the multiple considerations and problems encountered. One difficulty encountered in the efforts to recondense helium gas has been that of access to, and servicing of, the recondensing equipment. It is extremely important that the MRI be maintained in operating condition if at all possible during any serving of the recondensing equipment since discontinuance of superconducting operation to service the equipment can result in considerable down time and boiloff of the helium supply in the superconducting magnet assembly due to ramping down and the subsequent ramping up and shimming of the superconducting magnet to homogenous superconducting operation. Such procedures are necessarily costly in time and material, not the least of which is the expense associated with the inability to utilize the expensive MRI equipment during the down time period.

Other problems which should be addressed include the magnetic interferences generated by the cryocooler with its moving displacer which include magnetic material. Since quality MRI imaging requires an extremely homogenous magnetic field in the imaging bore, any magnetic interference can be extremely serious.

In addition, the mechanical cryocooler can introduce mechanical vibrations which can also affect imaging quality. Still further, it is desirable to provide good thermal isolation between the recondenser and the helium vessel to assist in maintaining superconducting operation and eliminate any liquid helium loss while servicing the recondensing equipment as discussed above. It is also desirable to enable the warming of the cold head sleeve during servicing to room temperature in order to melt any condensation and enable the removal of any contaminants which might otherwise interfere with the thermal contact between the cold head of the cryocooler and the heat station within the cryocooler sleeve upon re-installation of the cryocooler after servicing.

Details of helium recondensing equipment are disclosed in my copending patent application, entitled "Helium Recondensing Superconducting Magnet" filed Dec. 29, 1994, application Ser. No. 08/366,187, now abandoned and my U.S. Pat. No. 5,613,367, both of which assigned to the same assignee as the present invention.

OBJECTS AND SUMMARY OF INVENTION

It is an object of the present invention to provide an uncomplex yet improved cryogen recondensing superconducting magnet assembly with improved thermal efficiency.

It is another object of the present invention to provide recondensing apparatus in a superconducting magnet assembly in which magnetic disturbances are minimized.

It is still another object of the present invention to provide an improved recondensing helium cooled superconducting magnet assembly utilizing a cryocooler which can be readily removed and serviced without discontinuing superconducting magnet MRI system operation and any loss of liquid helium.

It is yet another object of the present invention to provide improved thermal and vibration isolation between the recondenser and the helium vessel of a superconducting magnet assembly.

In accordance with one form of the invention, a two stage cryocooler extends into the space between the helium vessel and the surrounding vacuum vessel in a superconducting magnet with the cold end or second stage of the cryocooler thermally connected to a recondenser. The recondenser is positioned within the same space above the liquid helium to contact the helium gas with the recondensed helium falling by gravity back to the liquid helium reservoir.

More particularly, the recondensing apparatus is positioned within the space between the helium vessel and surrounding vacuum vessel in thermal contact with a cryocooler within a fixed cryocooler sleeve in the vacuum vessel. The cryocooler is positioned at a position and at an angle to the axis of the superconducting magnet to minimize magnetic disturbances of the magnetic field generated by the magnet, and the sleeve is connected through thin corrugated stainless steel tubing to the helium vessel to provide thermal and vibration isolation.

DESCRIPTION OF DRAWINGS AND INVENTION

Figure 1:
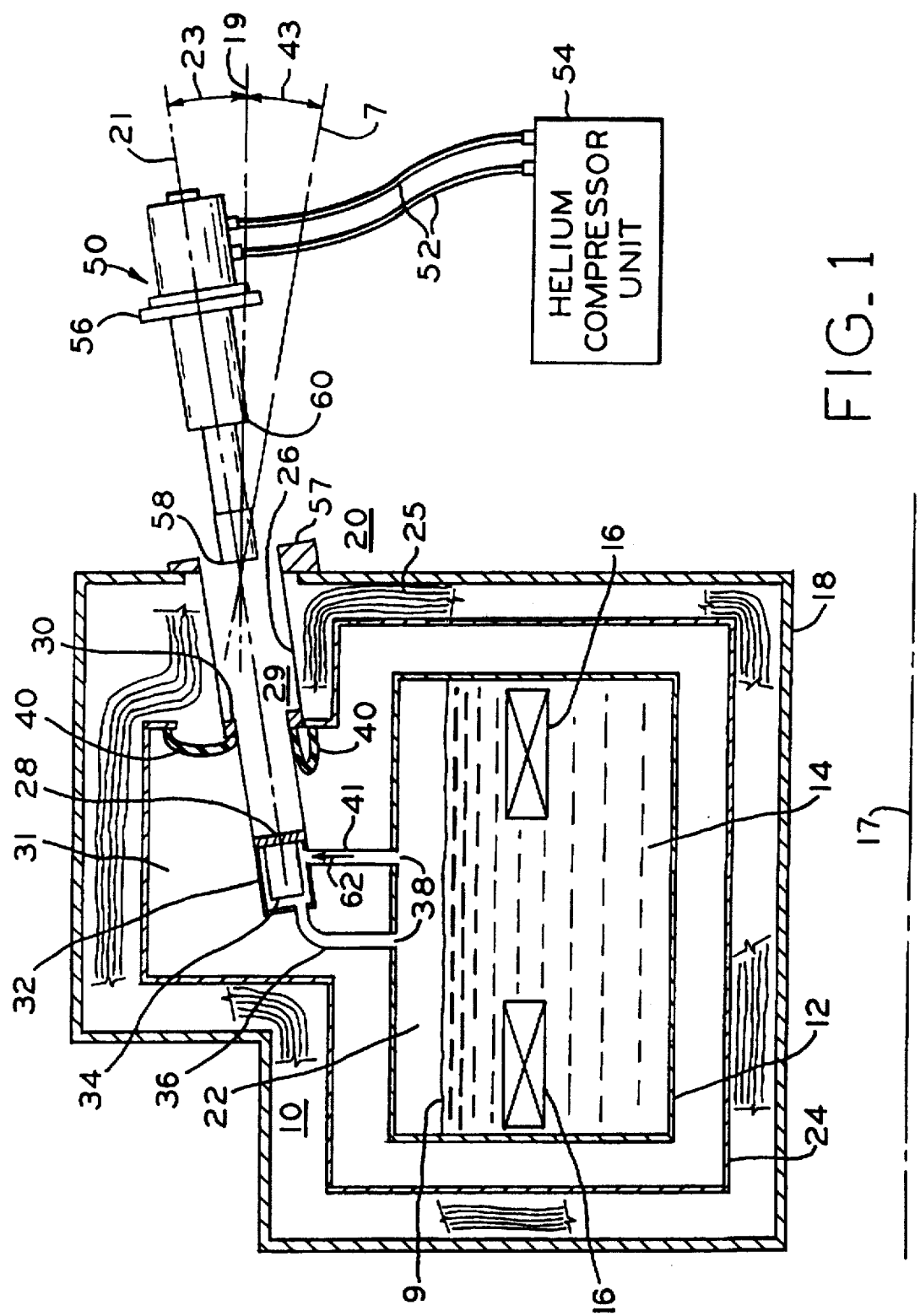
FIG. 1 is a cross-section of an MRI superconducting magnet incorporating the present invention in which the cryocooler is shown in somewhat enlarged form to better illustrate the invention.

Referring to FIG. 1, MRI superconducting magnet 10 includes a cryogen or helium vessel 12 which contains liquid helium cryogen 14 and a plurality of superconducting magnet coils 16 which when cooled to superconducting temperatures produces a highly uniform magnetic field within a central bore indicated generally by imaging bore axis 17 in a manner well known in the art. Surrounding helium vessel 12 is external vacuum vessel 18 which separates atmosphere 20 outside the vacuum vessel from helium vessel 12. One or more thermal shields such as 24 are interposed between vacuum vessel 18 and helium vessel 12. Multi-layer super-insulation such as shown at 25 is interposed between vacuum vessel 18 and thermal shield 24.

Cryocooler sleeve 26 extends from vacuum vessel 18 into space 31 between the vacuum vessel and thermal shield 24 and helium vessel 12. Cold end sleeve heat station or heat sink 28 is positioned at the interior end of cavity 29 formed by cryocooler sleeve 26. A shoulder or heat sink 30 forms the warmer end sleeve heat station for the cryocooler shown generally as 50 in somewhat enlarged form for clarity. Flexible copper braids 40 thermally connect warmer end sleeve heat station 30 to thermal shield 24. Positioned within the space 31 between thermal shield 24 and helium vessel 12 in thermal contact with cold end sleeve heat station 28 is recondenser container or housing 32 which encloses recondenser 34. A pair of stainless steel thin walled tubes 36 and 41 extend between recondenser container 32 and apertures 38 in the upper part of helium vessel 12 above liquid level 23. Tubes 36 and 41 are fabricated of bellows type corrugated stainless steel tubing of the type sold by American Boa Company of Cumming, Ga. under their designation PARRAP, which may, for example, be stainless steel 304 having an inside diameter of 12 millimeters.

Figure 3:
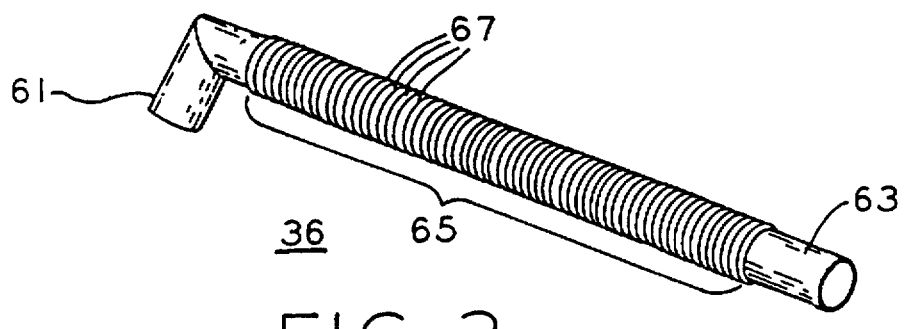
FIG. 3 shows details of the pleated tubes shown in FIG. 1.

Referring to FIG. 3, tube 36 includes stainless steel couplings 61 and 63 at the ends thereof connected by stainless steel bellows portion 65 including a plurality of pleats 67 enabling expansion and contraction of the pleats which dampen vibrations between couplings 61 and 63 and hence between cryocooler 50 and helium vessel 12. Tube 36 also provides a lengthened thermal connection through pleats 67 to assist in thermally isolating helium vessel 12 from recondenser container or housing 32 when cryocooler 50 is removed from cryocooler sleeve 26 during servicing or replacement of the cryocooler. Tube 41 is similar to tube 36 except that a right angle connector 61 is not utilized. Connector 61 is welded to recondenser housing 32 and connector 63 is welded to helium vessel 12 at aperture 38.

Cold head assembly or cryocooler 50 is dimensioned to be selectively insertable within cavity 29 of cryocooler sleeve 26 such that when inserted cold station 58 contacts cold end sleeve heat station 28, and warmer station 60 of cryocooler 50 contacts warmer end sleeve heat station or heat sink 30, with room temperature end 56 contacting collar 57 on vacuum vessel 18 closing cavity 29 to atmosphere 20 outside the vacuum vessel. Helium compressor unit 54 is connected through lines 52 to cryocooler 50 to provide the low temperatures required for the effective operation of recondenser 34 and thermal shield 24. Cryocooler 50 may be a Gifford-McMahon reciprocating refrigerator under their model designation SRDK-408 of SHI of Japan and provides a temperature of 4 degrees K at cold station 58 and a temperature of 40 degrees K at warmer station 60. The lower temperature is adequate to enable recondensing of helium gas shown by arrow 62 which flows from helium vapor space 22 above liquid helium level 9 of liquid helium 14 in helium vessel 12 to contact recondenser 34. Recondenser 34 recondenses helium gas 62 into liquid helium which flows by gravity back into helium vessel 12 in a manner described in my aforementioned patents.

The subject invention enables great flexibility in the placement of cryocooler 50 within cryocooler sleeve 26 relative to superconducting magnet coils 16 such that its position can be selected to minimize magnetic interference and purtabations with the magnetic field produced along axis 17 by superconducting magnet coils 16. The flexibility enables the angular placement of cryocooler 50 such that its axis 19 can be tilted such as that shown schematically by angles 23 and 43 relative to axis 17 of superconducting magnet 10. Axis 19, rather than being parallel to axis 17, can be at any angle from parallel to perpendicular to axis 17, with the angle selected to minimize magnetic interference by the moving displacer within cryocooler 50 with the magnetic fields along axis 17. In one design angle 23 is 20 degrees.

In addition, the dimensions of stainless steel tubes 36 and 37 including the length and diameter and numbers of, and distance between, pleats 67 can be selected to provide optimum minimized vibration isolation between cryocooler 50 and helium vessel 12, and also by providing adequate length tubes 36 and 37 provide thermal isolation between the cryocooler and helium vessel during servicing of the cryocooler. In one design the length of tubes 36 was 8 inches while their diameter was 0.47 inches.

Figure 2:
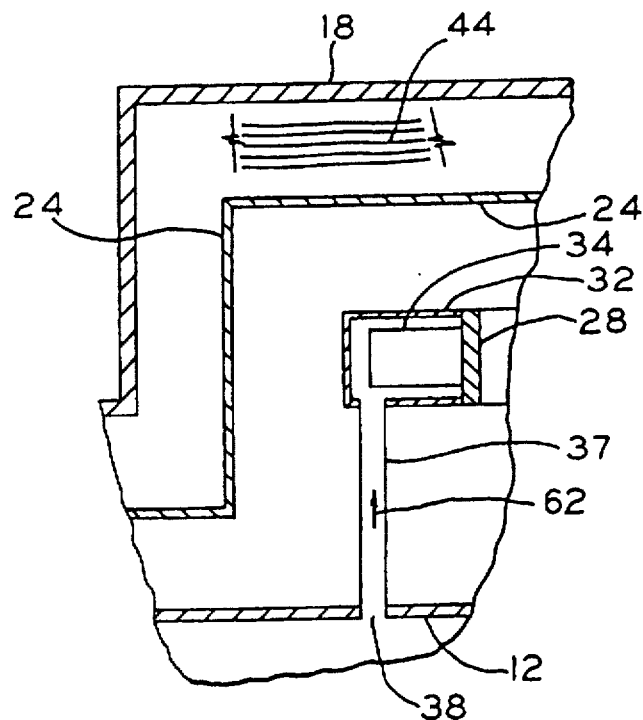
FIG. 2 is an enlarged cross-section of a portion of FIG. 1 illustrating a single tube connection between the recondenser and helium vessel of FIG. 1.

FIG. 2 shows an alternate embodiment of tubes 36 in that only a single tube 37 is connected between recondenser housing 32 and helium vessel 12. The length and diameter of the single tube 37 is selected to provide the desirable thermal and vibration isolation. In one single tube design the length of tube 37 is 8 inches while the diameter is 0.5 inches.

While only certain features of the invention have been illustrated and described herein, many modifications and changes will occur to those skilled in the art. It is, therefore, to be understood that the appended claims are intended to cover all such modifications and changes as fall within the true spirit of the invention.

What I claim is:

1. A liquid cryogen cooled superconducting magnetic resonance imaging magnet for generating a magnetic imaging field including cryogen gas recondensing apparatus comprising:

a liquid cryogen vessel to contain a liquid cryogen reservoir to provide cryogenic temperatures to said superconducting magnet assembly for superconducting operation resulting in the formation of cryogen gas;

a closed vacuum vessel surrounding said cryogen vessel and spaced from said cryogen vessel;

a cryocooler sleeve assembly extending through said vacuum vessel and selectively positioned in the space between said vacuum vessel and said cryogen vessel, and separating the atmosphere outside said vacuum vessel from the interior of said vacuum vessel;

a recondenser assembly in thermal contact with the end of said sleeve remote from said atmosphere;

a cryocooler removably positioned within said sleeve to render said cryogen gas to liquid cryogen for return to said liquid cryogen reservoir;

said recondenser being connected by tubing to at least one aperture in said liquid cryogen vessel; and said sleeve being positioned in said space to minimize magnetic interference with said magnetic imaging field.

2. The recondensing superconducting magnet of claim 1 wherein said magnet includes an axis and said cryocooler sleeve is positioned within said magnetic resonance imaging magnet at an angle to said axis.

3. The recondensing superconducting magnet of claim 2 wherein said magnet includes an axis and said cryocooler sleeve is positioned at an acute angle to said axis.

4. The recondensing superconducting magnet of claim 2 wherein said tubes include corrugated walls.

5. The recondensing superconducting magnet of claim 4 wherein said tubing is sized to allow said cryogen gas to flow upward into said recondenser and the recondensed cryogen gas to flow by gravity back into said cryogen vessel, and provide thermal and vibration isolation between said recondenser and said cryogen vessel.

6. The recondensing superconducting magnet of claim 5 wherein said cryogen gas is helium.

7. The recondensing superconducting magnet of claim 6 wherein a heat shield is positioned in said space between said vacuum vessel and said cryogen vessel, said cryocooler includes two stages with a cold station and a warmer station with said cold station thermally connected to said recondenser assembly and said warmer station thermally connected to said heat shield.

8. The recondensing superconducting magnet of claim 4 wherein said tubing includes two tubes between said recondenser assembly and said cryogen vessel to conduct said cryogen gas to said recondenser and provide a conduit for return of the recondensed cryogen gas to said cryogen vessel.

9. The recondensing superconducting magnet of claim 2 wherein said tubes are dimensioned to provide said thermal isolation between said sleeve and said cryogen vessel to enable continued superconducting operation and no cryogen loss from said magnet upon removal of said cryocooler from said sleeve.

10. The recondensing superconducting magnet of claim 9 wherein said tubes are stainless steel and include corrugated walls.

* * * * *

UNITED STATES PATENT AND TRADEMARK OFFICE
CERTIFICATE OF CORRECTION

PATENT NO. : 5,782,095
DATED : July 21, 1998
INVENTOR(S) : Chen, et al

It is certified that error appears in the above-identified patent and that said Letters Patent is hereby corrected as shown below:

On the title page, item [75] Inventor: should read – William Chen, Daniel C. Woods and John W. Spivey, all of Florence, S.C. --

Signed and Sealed this

Ninth Day of May, 2000

Attest:

Q. TODD DICKINSON

*Attesting Officer*      *Director of Patents and Trademarks*